US012433027B2

(12) United States Patent
Chien et al.

(10) Patent No.: US 12,433,027 B2
(45) Date of Patent: Sep. 30, 2025

(54) DISPLAY PANEL AND MANUFACTURING METHOD THEREOF

(71) Applicant: AUO Corporation, Hsin-Chu (TW)

(72) Inventors: I-Peng Chien, Hsin-Chu (TW); Tai-Tso Lin, Hsin-Chu (TW); Chen-Yuan Tu, Hsin-Chu (TW); Wen-Yung Wei, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 450 days.

(21) Appl. No.: 17/983,076

(22) Filed: Nov. 8, 2022

(65) Prior Publication Data

US 2023/0275101 A1 Aug. 31, 2023

Related U.S. Application Data

(60) Provisional application No. 63/313,744, filed on Feb. 25, 2022.

(30) Foreign Application Priority Data

Jul. 27, 2022 (TW) ................................. 111128197

(51) Int. Cl.
*H10D 86/60* (2025.01)
*H10D 86/01* (2025.01)
*H10D 86/40* (2025.01)

(52) U.S. Cl.
CPC ............ *H10D 86/60* (2025.01); *H10D 86/021* (2025.01); *H10D 86/443* (2025.01); *H10D 86/451* (2025.01)

(58) Field of Classification Search
None
See application file for complete search history.

(56) References Cited

U.S. PATENT DOCUMENTS 7,968,882 B2    6/2011  Lee
2020/0083474 A1*  3/2020  Lee ...................... H10K 59/131

FOREIGN PATENT DOCUMENTS

CN    110890405 A    3/2020
CN    114550227 A    5/2022

* cited by examiner

Primary Examiner — Bo B Jang
(74) Attorney, Agent, or Firm — WPAT, PC

(57) ABSTRACT

The present disclosure provides a display panel including a substrate, a pixel pad layer above the substrate, and a contact stack above the substrate and electrically connected the pixel pad layer. The contact stack includes a first metal layer, a second metal layer above the first metal layer, and a first interlayer insulation layer between the first metal layer and the second metal layer. The first interlayer insulation layer includes a first top portion covering an edge of a top surface of the first metal layer. The second metal layer is electrically connected to the top surface of the first metal layer exposed by the first interlayer insulation layer. A sidewall of the first interlayer insulation layer is recessed from a sidewall of the substrate by a first distance greater than zero.

20 Claims, 13 Drawing Sheets

DISPLAY PANEL AND MANUFACTURING METHOD THEREOF

CROSS-REFERENCE TO RELATED APPLICATION

This application claims priority to U.S. Provisional Application Ser. No. 63/313,744 filed Feb. 25, 2022, and Taiwan Application Serial Number 111128197, filed Jul. 27, 2022, the disclosures of which are incorporated herein by reference in their entireties.

BACKGROUND

Field of Invention

The present disclosure relates to the display panel and the manufacturing method thereof. More particularly, the present disclosure relates to the periphery circuit region of the display panel.

Description of Related Art

Splicing multiple display panels in a display device to form the display area of the device provides more detailed image quality and easier maintenance of the display device. The multiple display panels can be electrically connected to each other to receive the electric signals simultaneously. However, the periphery region of the multilayer structure of the display panel may be damaged during the cutting process. This leads to the problem of accurately splicing the display panels and affects the imaging performance of the display device. Therefore, how to prevent the above-mentioned defect of the display panel to improve the performance is a problem needs to be solved for the display device.

SUMMARY

According to some embodiments of the present disclosure, a display panel includes a substrate, a pixel pad layer above the substrate, and a contact stack above the substrate and electrically connected to the pixel pad layer. The contact stack includes a first metal layer, a second metal layer above the first metal layer, and a first interlayer insulation layer between the first metal layer and the second metal layer. The first interlayer insulation layer includes a first top portion covering an edge of a top surface of the first metal layer. The second metal layer is electrically connected to the top surface of the first metal layer exposed by the first interlayer insulation layer. A sidewall of the first interlayer insulation layer is recessed from a sidewall of the substrate by a first distance greater than zero.

In some embodiments, the sidewall of the first interlayer insulation layer is recessed from the sidewall of the substrate by the first distance between 0.1 μm and 1 μm.

In some embodiments, a second distance between a sidewall of the second metal layer and the sidewall of the substrate is between 20 μm and 200 μm.

In some embodiments, the first interlayer insulation layer includes a side portion covering a sidewall of the first metal layer, and the second metal layer covers the side portion of the first interlayer insulation layer.

In some embodiments, the first top portion of the first interlayer insulation layer is sandwiched between the top surface of the first metal layer and a bottom surface of the second metal layer.

In some embodiments, the first interlayer insulation layer includes a first opening exposing the top surface of the first metal layer, and the second metal layer extends through the first opening to contact the top surface of the first metal layer.

In some embodiments, the contact stack further includes a third metal layer between the first interlayer insulation layer and the second metal layer, and a second interlayer insulation layer between the third metal layer and the second metal layer, in which the second interlayer insulation layer includes a second top portion covering an edge of a top surface of the third metal layer.

In some embodiments, a sidewall of the second interlayer insulation layer is recessed from the sidewall of the first interlayer insulation layer by a third distance greater than zero.

In some embodiments, the sidewall of the second interlayer insulation layer is recessed from the sidewall of the first interlayer insulation layer by the third distance between 0.1 μm and 1 μm.

In some embodiments, the first interlayer insulation layer includes a first side portion covering a sidewall of the first metal layer, the third metal layer covers the first side portion of the first interlayer insulation layer, the second interlayer insulation layer includes a second side portion covering a sidewall of the third metal layer, and the second metal layer covers the second side portion of the second interlayer insulation layer.

In some embodiments, the contact stack further includes a metal underlayer below the first metal layer and a dielectric layer between the metal underlayer and the first metal layer, in which the dielectric layer includes a second opening exposing a top surface of the metal underlayer, the first metal layer extends through the second opening to contact the metal underlayer.

In some embodiments, a sidewall of the dielectric layer is coplanar with the sidewall of the substrate.

In some embodiments, the contact stack is disposed in a periphery circuit region of the display panel.

In some embodiments, the display panel further includes a transparent conductive layer continuously covering the pixel pad layer and the contact stack.

In some embodiments, a sidewall of the transparent conductive layer is noncoplanar with the sidewall of the substrate.

According to some embodiments of the present disclosure, a method of manufacturing a display panel includes the following steps. A first metal layer is formed above a substrate. A first interlayer insulation layer is formed above the first metal layer, in which the first interlayer insulation layer includes a top portion covering an edge of a top surface the first metal layer and a side portion covering a sidewall of the first metal layer, a sidewall the first interlayer insulation layer is recessed from a sidewall of the substrate by a first distance greater than zero. A second metal layer is formed above the first interlayer insulation layer and the first metal layer, in which the second metal layer extends through the first interlayer insulation layer and is electrically connected to the first metal layer to form a contact stack.

In some embodiments, the method further includes cutting the substrate along a cutting line of the substrate after forming the contact stack, in which the sidewall of the first interlayer insulation layer is between the sidewall of the first metal layer and the cutting line.

In some embodiments, a second distance between the sidewall of the first interlayer insulation layer and the cutting line is between 0.1 μm and 1 μm.

In some embodiments, a third distance between a sidewall of the second metal layer and the cutting line is between 20 µm and 200 µm.

In some embodiments, forming the first interlayer insulation layer includes forming a first insulation layer above the first metal layer that conformally covers the first metal layer, in which a sidewall of the first insulation layer is coplanar with the sidewall of the substrate. The first insulation layer is patterned to form the first interlayer insulation layer, in which the first interlayer insulation layer includes a first opening exposing the top surface of the first metal layer, and the sidewall of the first interlayer insulation layer after being patterned is recessed from the sidewall of the substrate by the first distance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
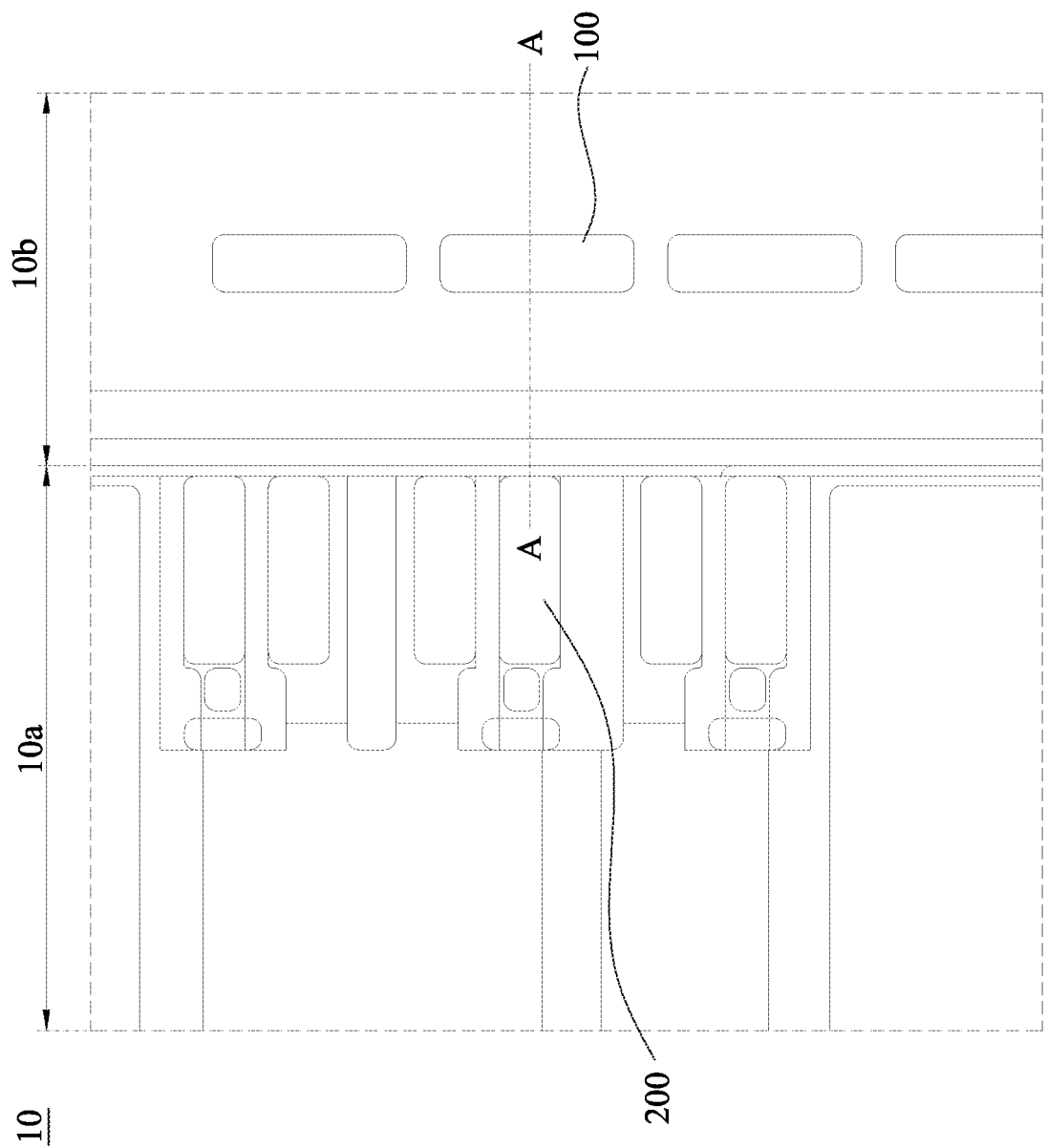
FIG. 1A illustrates a partial top view of a display panel according to one comparative example of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although terms "first", "second", "third", etc., are used herein to describe the elements, components, region, layers, and/or portions, it should be understood that these are not intended to be limiting. These terms are used to discriminate an element, component, region, layer, and/or portion from another element, component, region, layer, and/or portion. Therefore, the "first element" discussed below may be called as a second element, which does not depart from the spirit and scope of the present disclosure.

Figure 1B:
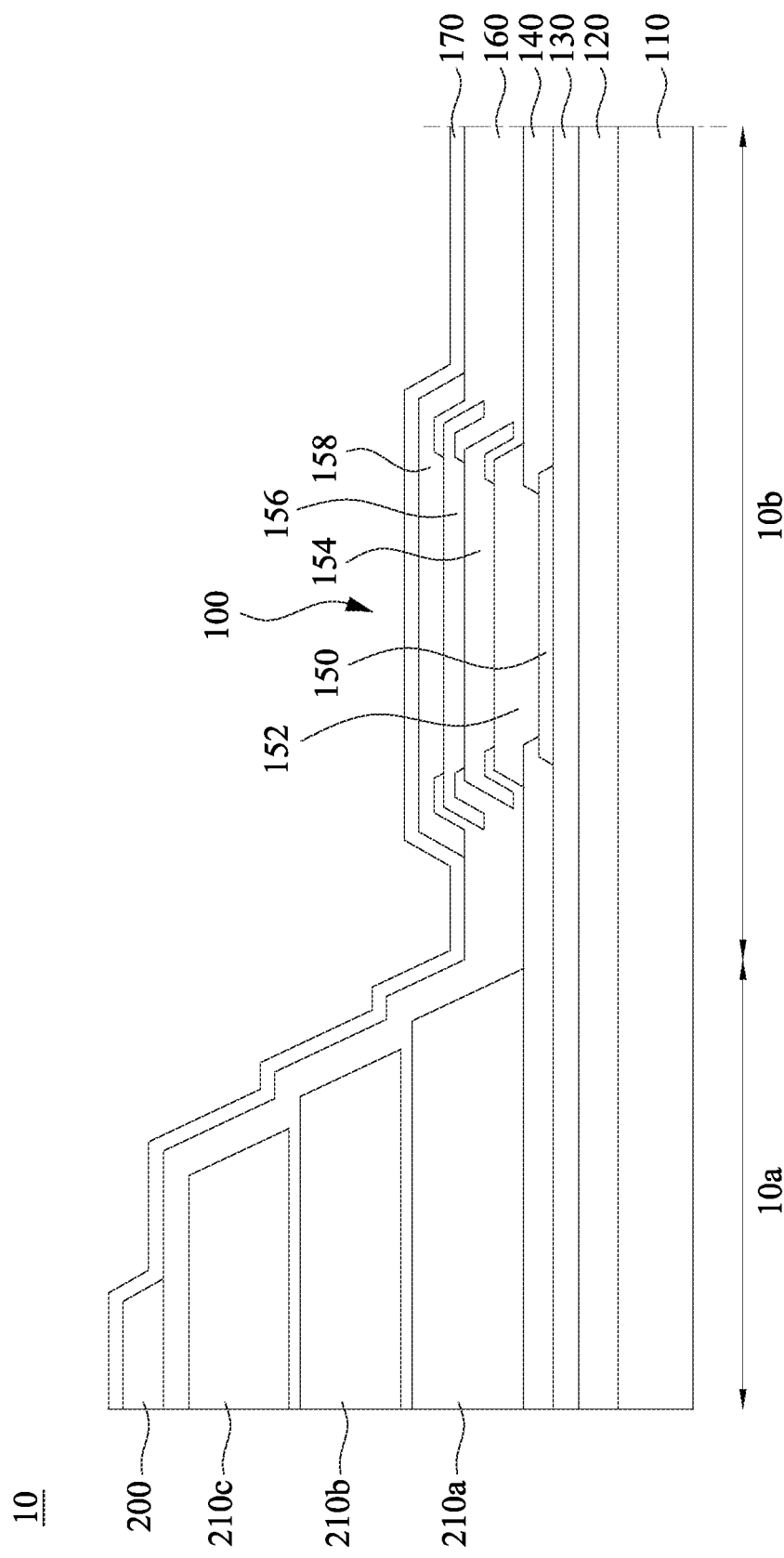
FIG. 1B illustrates a cross-sectional view of the display panel along line A-A' in FIG. 1A according to the comparative example of the present disclosure.

Referring to FIG. 1A and FIG. 1B, FIG. 1A illustrates a partial top view of a display panel 10 as a comparative example. FIG. 1B illustrates a cross-sectional view of the display panel 10 along line A-A' in FIG. 1A. The display panel 10 includes a pixel region 10a and a periphery circuit region 10b adjacent to the pixel region 10a.

Specifically, the pixel region 10a includes a pixel pad layer 200 below the pixel units. The periphery circuit region 10b includes a contact stack 100 with a multilayer structure. The contact stack 100 is electrically connected to the pixel pad layer 200 so that the electric signal may be transmitted to the pixel units in the pixel region 10a by the contact stack 100 and the pixel pad layer 200 to provide the image of the display panel 10. Some elements, such as the pixel unit on the pixel pad layer 200, may be omitted from the display panel 10 in FIG. 1A and FIG. 1B to clearly illustrate the corresponding positions of the illustrating contact stack 100 and the pixel pad layer 200.

More specifically, the display panel 10 includes a substrate 110, a buffer layer 120, an insulation layer 130, and a dielectric layer 140 that extend across the pixel region 10a and the periphery circuit region 10b. The substrate 110, the buffer layer 120, the insulation layer 130, and the dielectric layer 140 are collectively used as a carrier plate so that the pixel pad layer 200 and the contact stack 100 may be formed above one side of the substrate 110, for example, the front surface of the substrate 110. Additional flat layers may be formed between the pixel pad layer 200 and the carrier plate, such as the flat layer 210a, the flat layer 210b, and the flat layer 210c shown in FIG. 1B. As a result, the pixel pad layer 200 and the contact stack 100 may be located on different levels.

The contact stack 100 includes a multilayer structure formed of metal layers 150-158 and an interlayer insulation layer 160. The metal layers 150-158 at different levels of the contact stack 100 may be respectively electrically connected to various elements, thereby providing the flexible layout arrangement of the display panel 10. For example, the metal layer 158 at the top most level may be located at the same level as the pixel pad layer 200, where the metal layer 158 and the pixel pad layer 200 are electrically connected. The metal layer 150 as the bottom most metal layer (or referred as the metal underlayer) may be electrically connected to the drive circuit on the opposite side of the substrate 110, such as the back surface opposite to the front surface. The interlayer insulation layer 160 interposes between the metal layer 152 to the metal layer 158, isolating and protecting portions of the metal layer 152 to the metal layer 158. The interlayer insulation layer 160 may further extend between the flat layer 210a to the flat layer 210c below the pixel pad layer 200 so that the interlayer insulation layer 160 distributes across the pixel region 10a and the periphery circuit region 10b to form a firm display panel 10. In some embodiments, the display panel 10 may further include a transparent conductive layer 170 across the pixel region 10a and the periphery circuit region 10b, in which the transparent conductive layer 170 continuously covers the pixel pad layer 200, the contact stack 100, and the extended interlayer insulation layer 160.

As shown in FIG. 1B, the interlayer insulation layer 160 of the display panel 10 extends to the edge of the display panel 10, which the sidewall of the interlayer insulation layer 160 is coplanar with the sidewall of the substrate 110. In other words, when the substrate 110 is cut to form the display panel 10, the substrate 110 and the interlayer insulation layer 160 are cut together so the coplanar sidewall of the interlayer insulation layer 160 and the substrate 110 is formed. However, the interlayer insulation layer 160 may crack or break from the cutting spot during the cutting process. Since the interlayer insulation layer 160 in the contact stack 100 interposes between the metal layer 152 to the metal layer 158, the crack of the breakage of the interlayer insulation layer 160 may extend to the metal layer 152 to the metal layer 158, thereby damaging the contact stack 100 and impacting the signal transmittance in the display panel 10.

The present disclosure provides a display panel and its manufacturing method to solve the mentioned problem of the edge breakage of the display panel. The display panel of the present disclosure includes a substrate, a pixel pad layer above the substrate, and a contact stack electrically connected to the pixel pad layer. The contact stack includes a multilayer structure formed of a first metal layer, a second metal layer above the first metal layer, and a first interlayer insulation layer between the first metal layer and the second metal layer. When cutting the substrate to form the display panel, the sidewall of the first interlayer insulation layer is recessed from the sidewall of the substrate by a distance greater than zero. As a result, the impact on the first interlayer insulation layer during the cutting process of the substrate may be minimized to prevent the crack or breakage of the first interlayer insulation layer. Therefore, the contact stack of the present disclosure may remain an intact structure, which prevents the damage in the periphery circuit region of the display panel and improves the yield of the display panel.

Figure 2A:
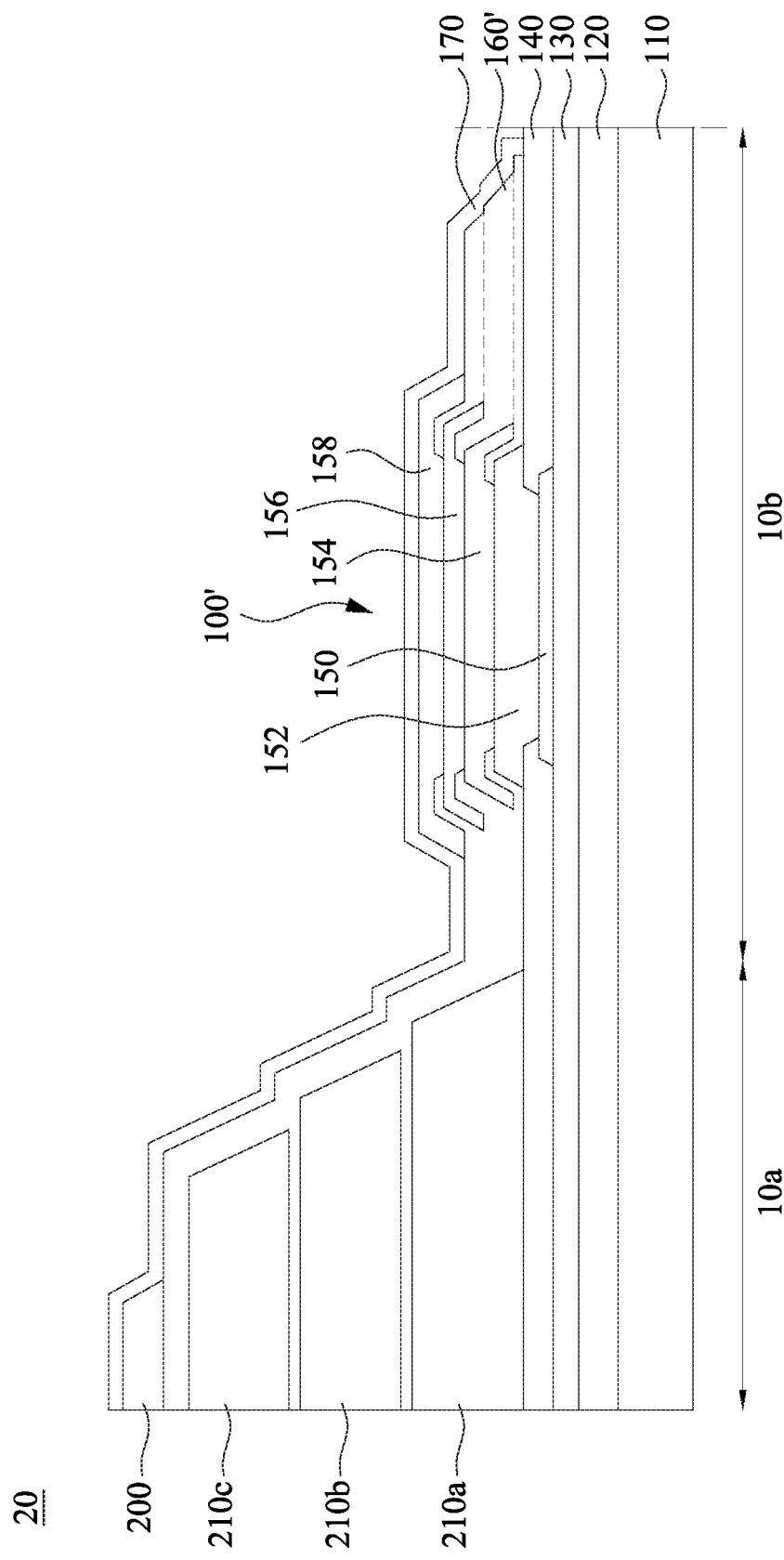
FIG. 2A illustrates a cross-sectional view of a display panel according to one embodiment the present disclosure.
Figure 2B:
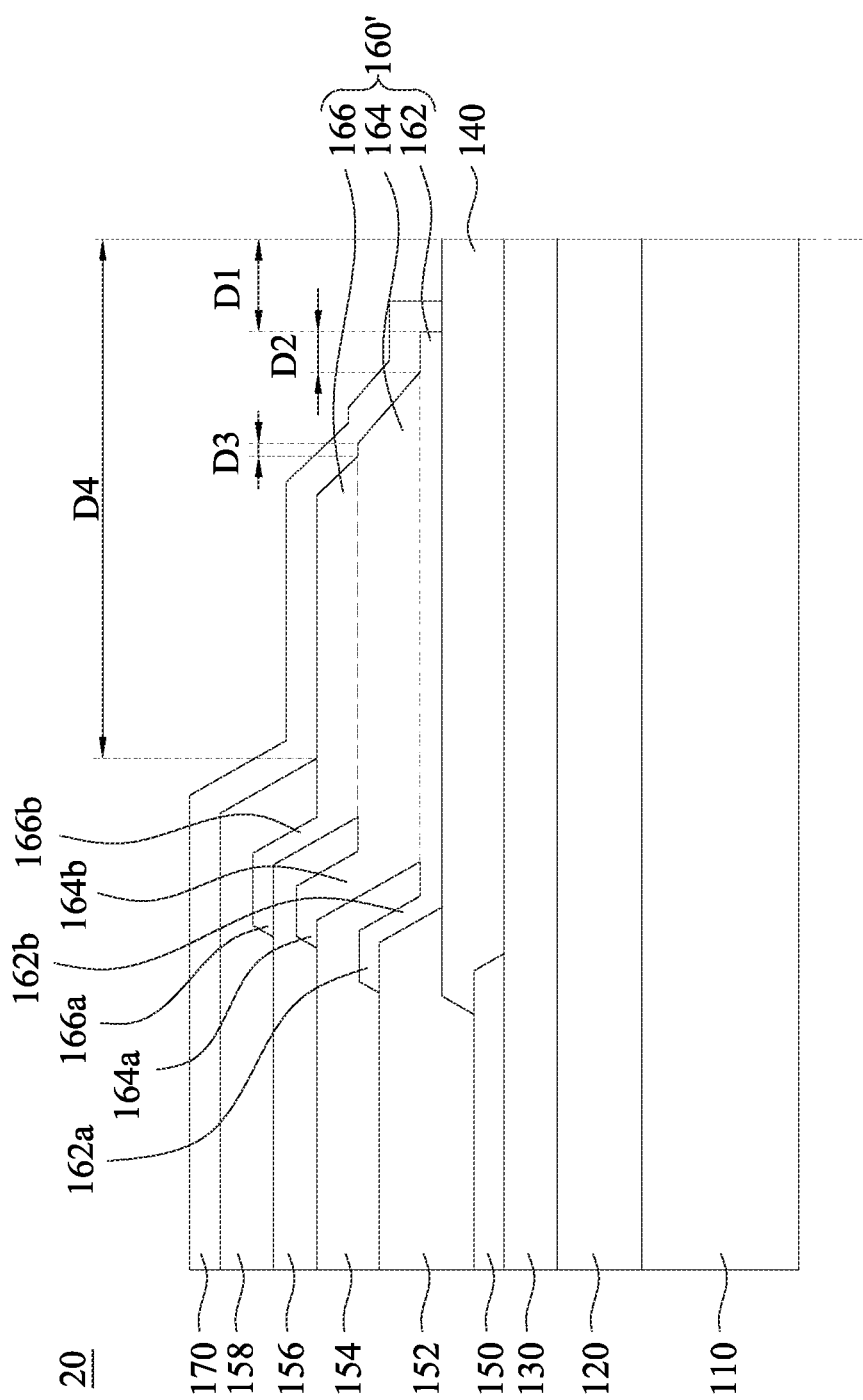
FIG. 2B illustrates a partial enlargement view of the display panel in FIG. 2A.

According to some embodiments of the present disclosure, FIG. 2A illustrates a cross-sectional view of a display panel 20. FIG. 2B illustrates a partial enlargement view of a contact stack 100' of the display panel 20 in FIG. 2A. The display panel 20 is similar to the display panel 10 in FIG. 1B, except for the structure of the contact stack 100' in the display panel 20 different from the contact stack 100 in the display panel 10. The contact stack 100' of the display panel 20 will be discussed in detail below, and other components of the display panel 20 similar to the display panel 10 will not be specifically described.

Referring to FIG. 2A and FIG. 2B, the contact stack 100' includes a multilayer structure formed of a metal layer 150, a metal layer 152, a metal layer 154, a metal layer 156, and a metal layer 158 arranged from bottom to top. The metal layers 150-158 in the contact stack 100' are electrically connected to each other. The metal layers 150-158 may include the metal material suitable for electrodes, such as copper. Although the contact stack 100' include five metal layers in the embodiment illustrated in FIG. 2A and FIG. 2B, the number of the metal layer of the contact stack 100' may depend on the display panel design; the contact stack 100' in other embodiments may include more than or less than five metal layers.

The dielectric layer 140 is disposed between the bottom most metal layer 150 and the metal layer 152 so that the dielectric layer 140 and the insulation layer 130 together protect the metal layer 150 as the metal underlayer. Specifically, the dielectric layer 140 covers the edge of the top surface of the metal layer 150 and the sidewalls of the metal layer 150, thereby the dielectric layer 140 being sandwiched between the top surface of the metal layer 150 and the bottom surface of the metal layer 152.

The interlayer insulation layer 160' above the dielectric layer 140 is interposed between the metal layers 152-158. As a result, the interlayer insulation layer 160' includes a first interlayer insulation layer 162 between the metal layer 152 and the metal layer 154, a second interlayer insulation layer 164 between the metal layer 154 and the metal layer 156, and a third interlayer insulation layer 166 between the metal layer 156 and the metal layer 158. Specifically, the first interlayer insulation layer 162 includes a top portion 162a covering the edge of the top surface of the metal layer 152 and a side portion 162b covering the sidewalls of the metal layer 152, in which the top portion 162a is sandwiched between the top surface of the metal layer 152 and the bottom surface of the metal layer 154. Similarly, the second interlayer insulation layer 164 includes a top portion 164a covering the edge of the top surface of the metal layer 154 and a side portion 164b covering the sidewalls of the metal layer 154. The third interlayer insulation layer 166 includes a top portion 166a covering the edge of the top surface of the metal layer 156 and a side portion 166b covering the sidewalls of the metal layer 156. The top most metal layer 158 is disposed above the third interlayer insulation layer 166 so that the top portion 166a is sandwiched between the top surface of the metal layer 156 and the bottom surface of the metal layer 158.

As shown in FIG. 2B, the sidewall of the first interlayer insulation layer 162 in the interlayer insulation layer 160' is closest to the edge of the substrate 110 but the sidewall of the first interlayer insulation layer 162 is noncoplanar with the sidewall of the substrate 110. More specifically, the sidewall of the first interlayer insulation layer 162 is recessed from the sidewall of the substrate 110 by a first distance D1 greater than zero. The first distance D1 herein is defined as the distance between the orthographic projection of the sidewall of the first interlayer insulation layer 162 on the substrate 110 and the sidewall of the substrate 110. In other words, the entire interlayer insulation layer 160' is recessed from the sidewall of the substrate 110 by a distance greater than zero, thereby keeping the interlayer insulation layer 160' away from the sidewall of the substrate 110 formed by cutting.

Since the sidewalls of the interlayer insulation layer 160' and substrate 110 are separated, the interlayer insulation layer 160' would not be cut during the cutting process of the substrate 110, thereby preventing the interlayer insulation layer 160' from crack or breakage. Therefore, the interlayer insulation layer 160' having the intact structure protects the metal layer 152 to the metal layer 158 in the contact stack 100' and does not form the crack extending to the metal layer 152 to the metal layer 158 that damages the contact stack 100'. In addition, the interlayer insulation layer 160' without the cracks may maintain the integrity of the periphery circuit region 10b of the display panel 20, leading to the direct splicing of the periphery circuit regions 10b of multiple display panels 20 to form the frameless panel of the display device. This frameless splicing may maximize the display area of the display device as well as reduce the material wastage and cost. In other examples, the interlayer insulation layer 160' maintains the integrity of periphery circuit region 10*b* so that the contact stack 100' may be electrically connected to the drive circuit on the other side of the substrate 110 by the edge of the periphery circuit region 10*b*.

In some embodiments, the sidewall of the first interlayer insulation layer 162 may be recessed from the sidewall of the substrate 110 by the first distance D1 greater than 0.1 μm to ensure the intact structure of the interlayer insulation layer 160'. For example, the first distance D1 may be between 0.1 μm and 100 μm. If the first distance D1 is smaller than 0.1 μm, the sidewall of the first interlayer insulation layer 162 may be too close to the sidewall of the substrate 110 to prevent the first interlayer insulation layer 162 from being given a force that causes cracks during the cutting process of the substrate 110. If the first distance D1 is greater than 100 μm, the distance between the sidewall of the first interlayer insulation layer 162 and the sidewall of the substrate 110 may be too far, which results in the unnecessary functionless edge region of the display panel 20 that affects the splicing between the display panels 20 or increasing the cost.

In some embodiments, the sidewalls of the second interlayer insulation layer 164 and the third interlayer insulation layer 166 above the first interlayer insulation layer 162 may be further recessed from the sidewall of the first interlayer insulation layer 162 to ensure the intact structure of the interlayer insulation layer 160'. For example, as shown in FIG. 2B, the sidewall of the second interlayer insulation layer 164 may be recessed from the sidewall of the first interlayer insulation layer 162 below by a second distance D2 greater than zero. The sidewall of the third interlayer insulation layer 166 may be recessed from the sidewall of the second interlayer insulation layer 164 below by a third distance D3 greater than zero. The second distance D2 herein is defined as the distance between the orthographic projections of the sidewall of the second interlayer insulation layer 164 and the sidewall of the first interlayer insulation layer 162 on the substrate 110. The third distance D3 herein is defined as the distance between the orthographic projections of the sidewall of the third interlayer insulation layer 166 and the sidewall of the second interlayer insulation layer 164.

In other words, the sidewalls of the first interlayer insulation layer 162, the second interlayer insulation layer 164, and the third interlayer insulation layer 166 close to the sidewall of the substrate 110 may be gradually away from the edge of the substrate 110, which forms the stepped structure of the interlayer insulation layer 160'. Since the second interlayer insulation layer 164 and the third interlayer insulation layer 166 are further away from the sidewall of the substrate 110 than the first interlayer insulation layer 162, the overall sidewall of the interlayer insulation layer 160' and the sidewall of the substrate 110 are separated by the gap no smaller than the first distance D1. In some cases, the second distance D2 and the third distance D3 may be between 0.1 μm and 1 μm. In the embodiments which the interlayer insulation layer 160' has the stepped structure, the top of the sidewall of the second interlayer insulation layer 164 or the third interlayer insulation layer 166 may be further away from the sidewall of the substrate 110, leading to the tilted sidewall of the second interlayer insulation layer 164 or the third interlayer insulation layer 166 inclining toward the metal layer (for example, the metal layer 158) in the multilayer structure.

In some embodiments, the top most metal layer 158 is above the interlayer insulation layer 160', and the sidewall of the top most metal layer 158 may be the metal layer sidewall in the contact stack 100' closest to the edge of the substrate 110. The sidewall of the metal layer 158 closest to the edge of the substrate 110 may be distanced from the sidewall of the substrate 110 by an appropriate fourth distance D4 to ensure the intact structure of the metal layers in the contact stack 100'. For example, the fourth distance D4 may be between 20 μm and 200 μm. If the fourth distance D4 is smaller than 20 μm, the sidewall of the metal layer 158 may be too close to the sidewall of the substrate 110 so the interlayer insulation layer 160' between the sidewall of the metal layer 158 and the sidewall of the substrate 110 is insufficient to protect the metal layer 158 during the cutting process of the substrate 110. If the fourth distance D4 is greater than 200 μm, the distance between the sidewall of the metal layer 158 and the sidewall of the substrate 110 may be too far, which results in the unnecessary functionless edge region of the display panel 20 that affects the splicing between the display panels 20 or increasing the cost.

In some embodiments, the sublayers of the interlayer insulation layer 160' and the metal layers of the contact stack 100' may be alternately arranged as a multilayer structure so the interlayer insulation layer 160' and the metal layers protect each other to form a firm structure. For example, as shown in FIG. 2B, the top portion 162*a* of the first interlayer insulation layer 162 covers the edge of the top surface of the metal layer 152, and the side portion 162*b* of the first interlayer insulation layer 162 covers the sidewalls of the metal layer 152. The metal layer 154 on the first interlayer insulation layer 162 continuously covers the top portion 162*a* and the side portion 162*b* of the first interlayer insulation layer 162, which forms the bended shape of the metal layer 154. Similarly, the top portion 164*a* and the side portion 164*b* of the second interlayer insulation layer 164 respectively covers the edge of the top surface and the sidewalls of the metal layer 154, and the metal layer 156 on the second interlayer insulation layer 164 continuously covers the top portion 164*a* and the side portion 164*b*. The top portion 166*a* and the side portion 166*b* of the third interlayer insulation layer 166 respectively covers the edge of the top surface and the sidewalls of the metal layer 156, and the metal layer 158 on the third interlayer insulation layer 166 continuously covers the top portion 166*a* and the side portion 166*b*. In some embodiments which the interlayer insulation layer 160' and the metal layers are alternately arranged, the metal layers 152-158 may have tilted sidewalls so that the side portion 162*b* to the side portion 166*b* of the first interlayer insulation layer 162 to the third interlayer insulation layer 166 also have the conformal tilted sidewalls.

In some embodiments, the first interlayer insulation layer 162 may include an opening that exposes the top surface of the metal layer 152, where the first interlayer insulation layer 162 covers the edge of the top surface of the metal layer 152 and exposes the center of the top surface of the metal layer 152. As shown in FIG. 2B, the metal layer 154 above the metal layer 152 may extend through the opening of the first interlayer insulation layer 162 to contact the top surface of the metal layer 152, thereby forming the conductive path between the metal layer 152 and the metal layer 154. Similarly, the second interlayer insulation layer 164 may include an opening exposing the top surface of the metal layer 154 so that the metal layer 156 above the metal layer 154 extends through the opening of the second interlayer insulation layer 164 to contact the top surface of the metal layer 154. The third interlayer insulation layer 166 may include an opening exposing the top surface of the metal layer 156 so that the metal layer 158 above the metal layer 156 extends through the opening of the third interlayer insulation layer 166 to contact the top surface of the metal layer 156. As a result, the conductive path between the metal layers of the contact stack 100' may be formed by the vertical vias in the contact stack 100', which lowers the difficulty of pattering the contact stack 100'.

In some embodiments, the dielectric layer 140 may include an opening that exposes the top surface of the metal layer 150, where the dielectric layer 140 covers the edge of the top surface of the metal layer 150 and exposes the center of the top surface of the dielectric layer 140. As shown in FIG. 2B, the metal layer 152 above the metal layer 150 may extend through the opening of the dielectric layer 140 to contact the top surface of the metal layer 150, thereby forming the conductive path between the metal layer 150 and the metal layer 152. As a result, the conductive path between the metal underlayer, i.e., metal layer 150 and the upper metal layers of the contact stack 100' may be formed by the vertical vias in the contact stack 100', which lowers the difficulty of pattering the contact stack 100'. In some cases, the metal layer 150 is further away from the sidewall of the substrate 110 compared to other metal layers. Therefore, the sidewall of the dielectric layer 140 can be coplanar with the sidewall of the substrate 110 without impacting the metal layers in the contact stack 100'.

In some embodiments, the first interlayer insulation layer 162, the second interlayer insulation layer 164, and the third interlayer insulation layer 166 may include the same material so that the interlayer insulation layer 160' does not have an obvious interface therein. For example, the first interlayer insulation layer 162, the second interlayer insulation layer 164, and the third interlayer insulation layer 166 may include silicon nitride, silicon oxide, silicon oxynitride or the like. In some embodiments, the dielectric layer 140 and the interlayer insulation layer 160' may include different materials that form the interface between the dielectric layer 140 and the interlayer insulation layer 160', although this is not intended to be limiting. For example, the interlayer insulation layer 160' may include silicon nitride while the dielectric layer 140 includes silicon oxide.

Figure 3:
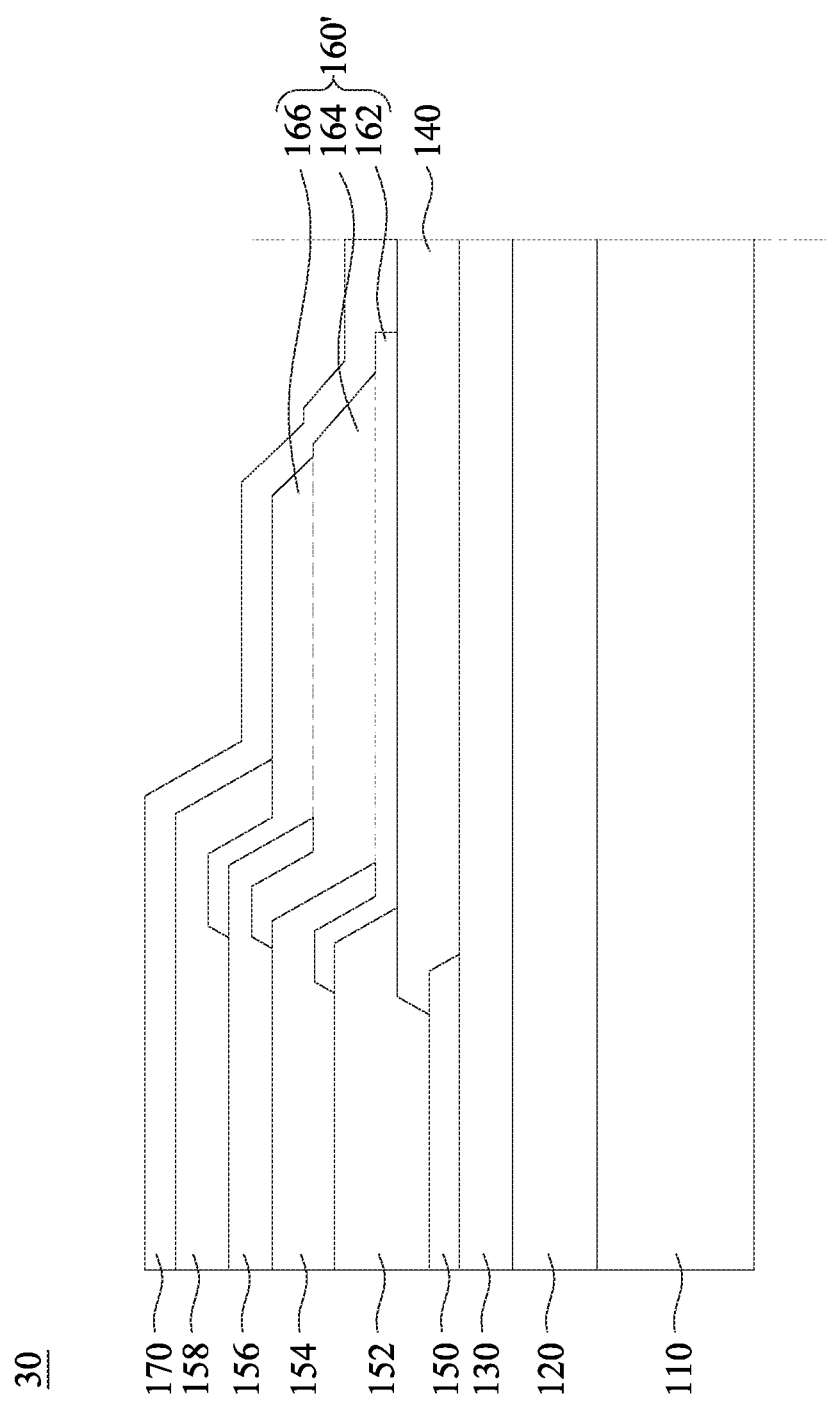
FIG. 3 illustrates a cross-sectional view of the display panel according to another embodiment of the present disclosure.

In some embodiments, as shown in FIG. 2B, the sidewall of the transparent conductive layer 170 above the metal layer 158 may be recessed from the sidewall of the substrate 110 by a distance so that the sidewall of the transparent conductive layer 170 is noncoplanar with the sidewall of the substrate 110. In some other embodiments, the sidewall of the transparent conductive layer 170 may be coplanar with the sidewall of the substrate 110. FIG. 3 illustrates a cross-sectional view of a display panel 30 according to one embodiment of the present disclosure. As shown in FIG. 3, the display panel 30 is similar to the display panel 20 in FIG. 2A except that the transparent conductive layer 170 on the contact stack 100' of the display panel 30 extends to the same position as the sidewall of the substrate 110. As a result, the sidewall of the transparent conductive layer 170 is coplanar with the sidewall of the substrate 110.

According to some embodiments of the present disclosure, FIG. 4A through FIG. 4H illustrate the cross-sectional views of a display panel at various intermediate stages of the manufacturing process. FIG. 4A through FIG. 4H will be illustrated by taking the display panel 20 in FIG. 2A as an example. However, those skilled in the art should appreciate that the display panel manufacturing process of the present disclosure is not limited to the manufacturing of display panel 20. Additional operations may be applied before, during or after the manufacturing process of FIG. 4A through FIG. 4H, and the operations illustrated in FIG. 4A through FIG. 4H may be eliminated or substituted.

Figure 4A:
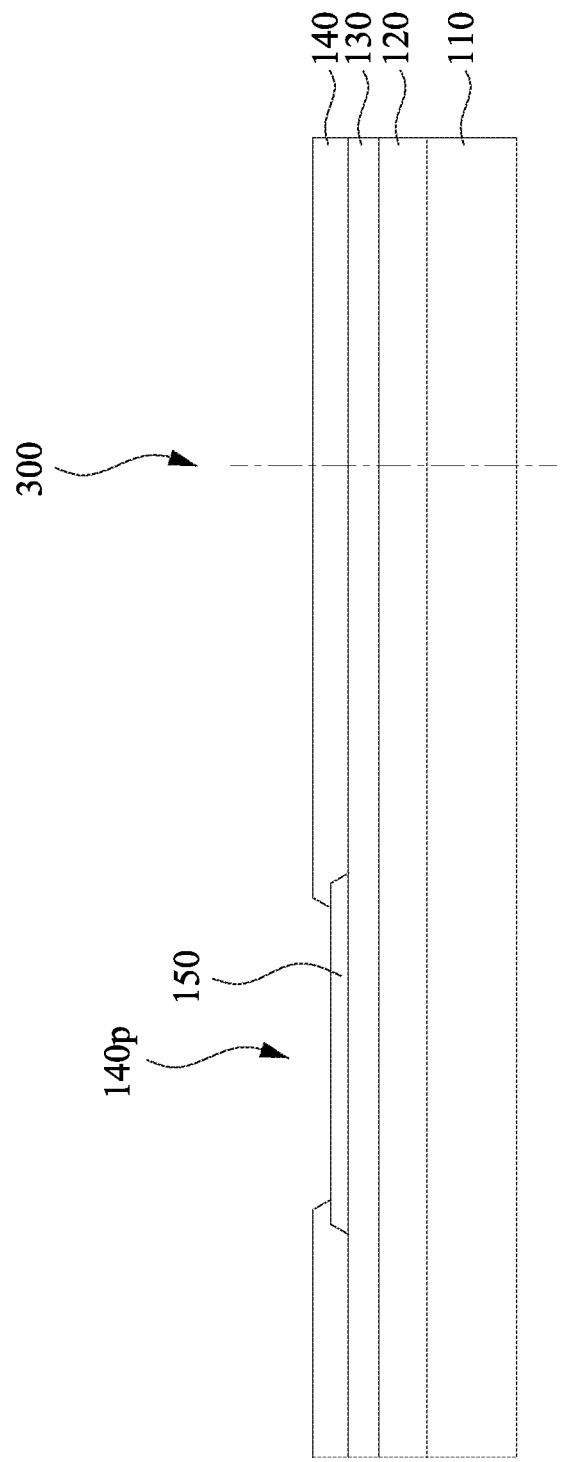
FIG. 4A through FIG. 4H illustrates cross-sectional views of a display panel at intermediated stages of the manufacturing process according to some embodiments of the present disclosure.

Referring to FIG. 4A, the bottom most metal layer 150 is formed above the substrate 110. Specifically, a blanket metal material layer is first formed above the substrate 110. The blanket metal material layer is then patterned to form the metal layer 150. The sidewall of the patterned metal layer 150 is away from the sidewall of the substrate 110 and also away from a cutting line 300 of the substrate 110. After forming the metal layer 150, a dielectric material layer is formed on the metal layer 150 and patterned to form the dielectric layer 140. As shown in FIG. 4A, the dielectric layer 140 includes an opening 140p that exposes the top surface of the metal layer 150. In some embodiments, before forming the metal layer 150, the buffer layer 120 and the insulation layer 130 may be formed on the substrate 110 to provide higher adhesion between the elements above the substrate 110 and the substrate 110 or prevent the elements from being affected by those on the opposite side of the substrate 110.

Figure 4B:
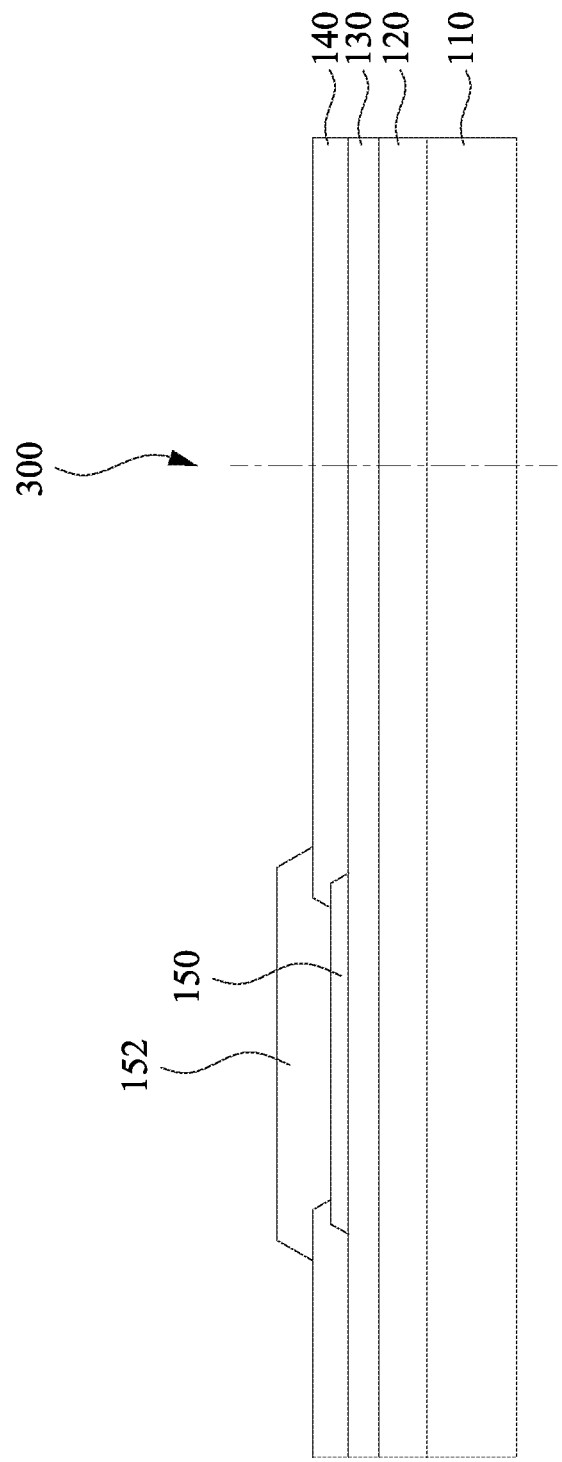

Referring to FIG. 4B, the metal layer 152 is formed above the substrate 110, where the metal layer 152 is positioned on and electrically connected to the metal layer 150. Specifically, a blanket metal material layer is first formed on the metal layer 150 and the dielectric layer 140 to fill in the opening 140p of the dielectric layer 140 and contact the top surface of the metal layer 150. The metal material layer is then patterned to form the metal layer 152. The sidewall of the patterned metal layer 152 is away from the sidewall of the substrate 110 and also away from the cutting line 300 of the substrate 110. In some embodiments, the patterned metal layer 152 may have the tilted sidewalls so that the top of the sidewall of the metal layer 152 is further away from the cutting line 300 of the substrate 110 compared to the bottom of the sidewall.

Figure 4C:
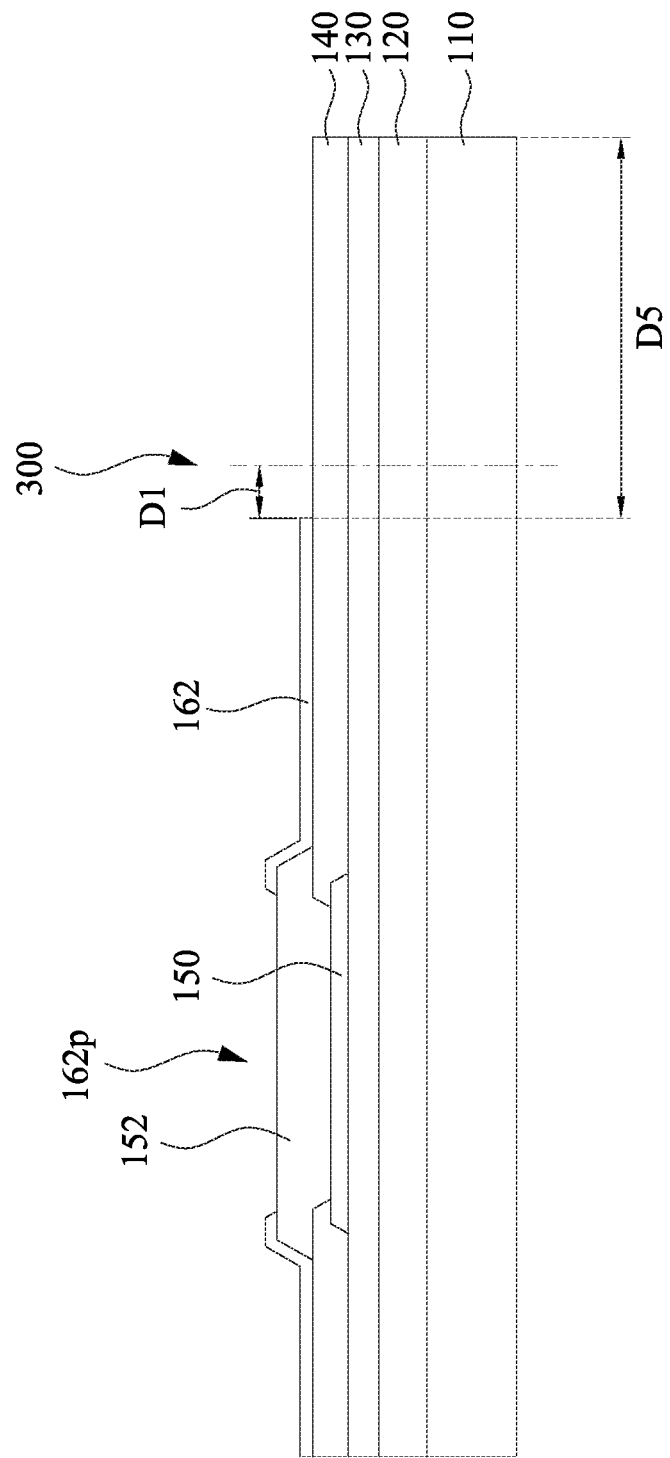

Referring to FIG. 4C, the first interlayer insulation layer 162 is formed above the metal layer 152, where the first interlayer insulation layer 162 includes a top portion covering the edge of the top surface of the metal layer 152 and a side portion covering the sidewall of the metal layer 152. Specifically, a blanket insulation layer is first formed on the metal layer 152 to conformally cover the top surface and the sidewalls of the metal layer 152, in which the sidewall of the blanket insulation layer is coplanar with the sidewall of the substrate 110. The insulation layer is then patterned to form the first interlayer insulation layer 162 including an opening 162p so that the top surface of the metal layer 152 is exposed through the opening 162p.

The sidewall of the patterned first interlayer insulation layer 162 is recessed from the sidewall of the substrate 110 by a distance, leading to the noncoplanar sidewalls of the first interlayer insulation layer 162 and the substrate 110. Specifically, the sidewall of the first interlayer insulation layer 162 which is closer to the edge of the substrate 110 is recessed from the sidewall of the substrate 110 by a fifth distance D5 greater than zero. As a result, the sidewall of the first interlayer insulation layer 162 is away from the sidewall of the substrate 110. More specifically, the cutting line 300 of the substrate 110 is positioned between the sidewall of the first interlayer insulation layer 162 and the sidewall of the substrate 110 so that the sidewall of the first interlayer insulation layer 162 is distanced from the cutting line 300 by a first distance D1. In some embodiments, the first distance D1 may be between 0.1 μm and 1 μm. It should be noted that the first interlayer insulation layer 162 covers the sidewall of the metal layer 152, thereby forming the sidewall of the first interlayer insulation layer 162 between the sidewall of the metal layer 152 and the cutting line 300.

Figure 4D:
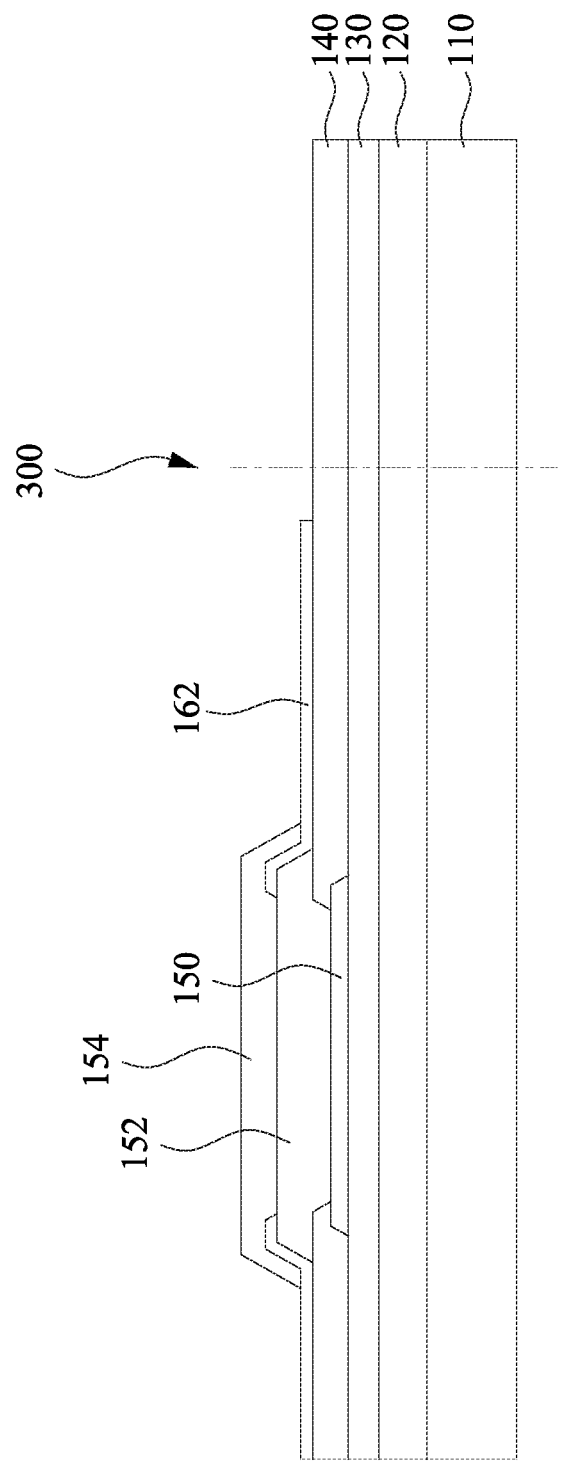

Referring to FIG. 4D, the metal layer 154 is formed above the first interlayer insulation layer 162 and the metal layer 152, where the metal layer 154 is positioned on and electrically connected to the metal layer 152. Specifically, a blanket metal material layer is first formed on the metal layer 152 and the first interlayer insulation layer 162 to fill in the opening 162p of the first interlayer insulation layer 162 and contact the top surface of the metal layer 152. The metal material layer is then patterned to form the metal layer 154. The sidewall of the patterned metal layer 154 is away from the sidewall of the substrate 110 and also away from the cutting line 300 of the substrate 110. As shown in FIG. 4D, the patterned metal layer 154 may cover the top portion and the side portion of the first interlayer insulation layer 162 so that the metal layer 154 has a bended shape. In other words, a width of the top surface of the metal layer 154 may be greater than that of the top surface of the metal layer 152, while the sidewall of the first interlayer insulation layer 162 is still between the sidewall of the metal layer 154 and the cutting line 300 of the substrate 110.

Figure 4E:
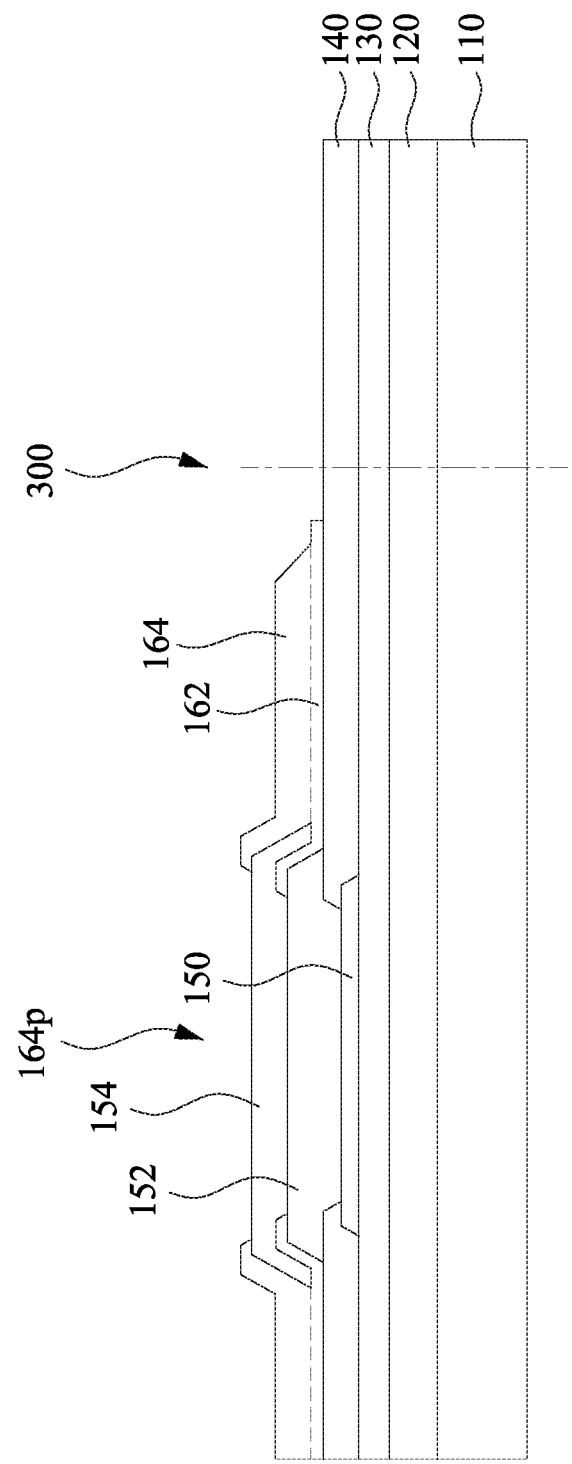

Referring to FIG. 4E, the second interlayer insulation layer 164 is formed above the metal layer 154, where the second interlayer insulation layer 164 includes a top portion covering the edge of the top surface of the metal layer 154 and a side portion covering the sidewall of the metal layer 154. Specifically, a blanket insulation layer is first formed on the metal layer 154 to conformally cover the top surface and the sidewalls of the metal layer 152, in which the sidewall of the blanket insulation layer is coplanar with the sidewall of the substrate 110. The insulation layer is then patterned to form the second interlayer insulation layer 164 including an opening 164p so that the top surface of the metal layer 154 is exposed through the opening 164p. The sidewall of the patterned second interlayer insulation layer 164 is recessed from the sidewall of the substrate 110 by a distance, leading to the sidewall of the second interlayer insulation layer 164 away from the cutting line 300 of the substrate 110. More specifically, the sidewall of the second interlayer insulation layer 164 may be recessed from the sidewall of the first interlayer insulation layer 162 by a distance greater than zero. As a result, the sidewall of the first interlayer insulation layer 162 is between the sidewall of the second interlayer insulation layer 164 and the cutting line 300.

Figure 4F:
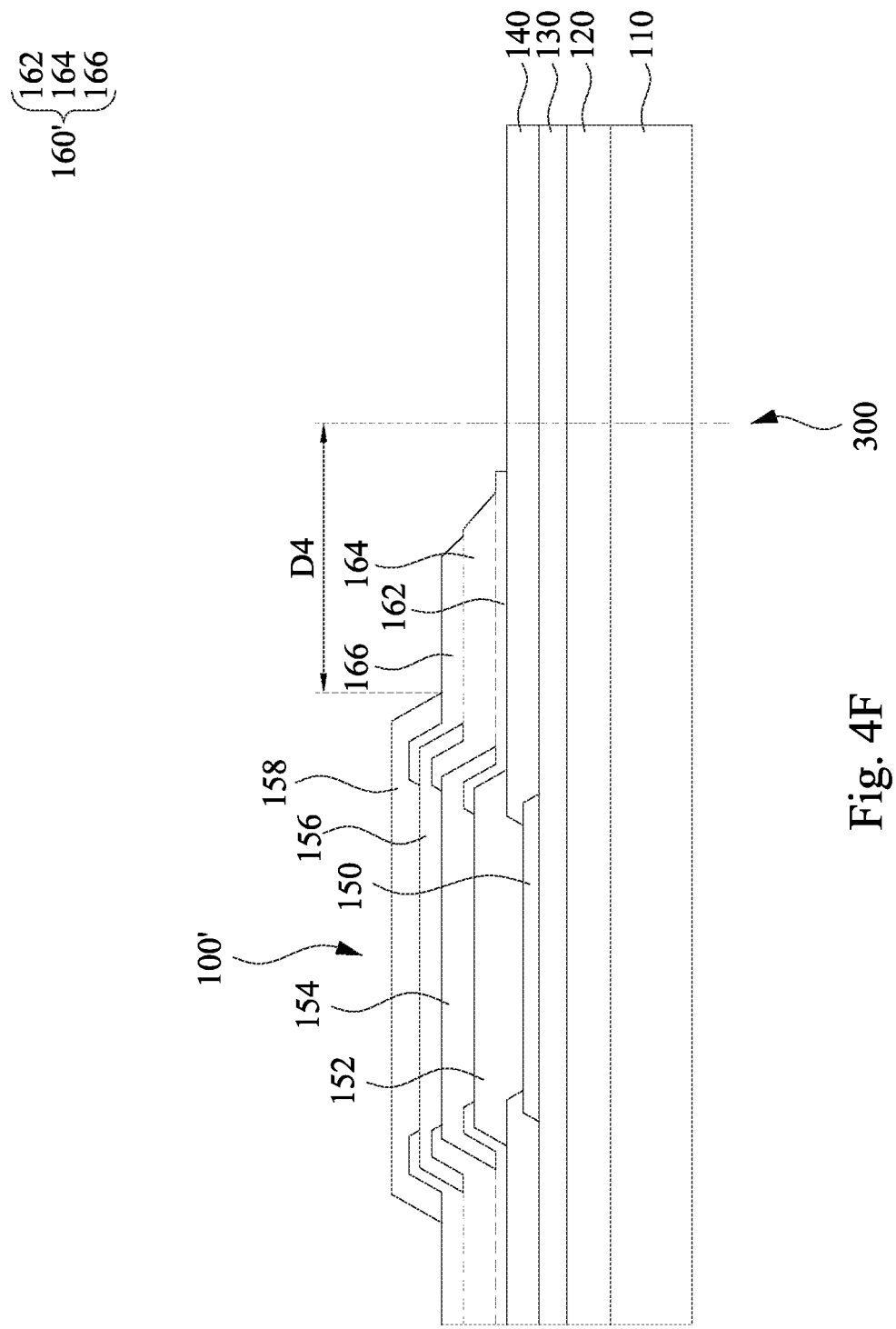

Referring to FIG. 4F, repeating the operations illustrated in FIG. 4D through FIG. 4E until multilayer structure has enough metal layers and interlayer insulation layers, where the top most layer of the multilayer structure is the metal layer. For example, as shown in FIG. 4F, the metal layer 156 is formed above the second interlayer insulation layer 164 and the metal layer 154 so that the metal layer 156 is positioned on the metal layer 154 and extends through the opening 164p of the second interlayer insulation layer 164 to be electrically connected to the metal layer 154. The third interlayer insulation layer 166 is then formed above the metal layer 156, in which the third interlayer insulation layer 166 includes a top portion covering the edge of the top surface of the metal layer 156 and a side portion covering the sidewall of the metal layer 156. The metal layer 158 is then formed above the third interlayer insulation layer 166 and the metal layer 156 so that the metal layer 158 is positioned on the metal layer 156 and extends through the opening of the third interlayer insulation layer 166 to be electrically connected to the metal layer 156. The first interlayer insulation layer 162, the second interlayer insulation layer 164, and the third interlayer insulation layer 166 collectively form the interlayer insulation layer 160'. The metal layer 150, the metal layer 152, the metal layer 154, the metal layer 156, the metal layer 158 and the interlayer insulation layer 160' alternately arranged with the metal layers collectively form the contact stack 100'.

Although the width of the top surface of the metal layer 156 may be greater than that of the top surface of the metal layer 154, and the width of the top surface of the metal layer 158 may be greater than that of the top surface of the metal layer 156, the sidewall of the first interlayer insulation layer 162 is still between the sidewall of the metal layer 158 and the cutting line 300 of the substrate 110 to form the sidewall of the metal layer 158 away from the cutting line 300. For example, the sidewall of the metal layer 158 may be distanced from the cutting line 300 by a fourth distance D4 between 20 μm and 200 μm. The sidewall of the third interlayer insulation layer 166 may be recessed from the sidewall of the second interlayer insulation layer 164 by a distance greater than zero so that the sidewall of the second interlayer insulation layer 164 is between the sidewall of the third interlayer insulation layer 166 and the cutting line 300.

Figure 4G:
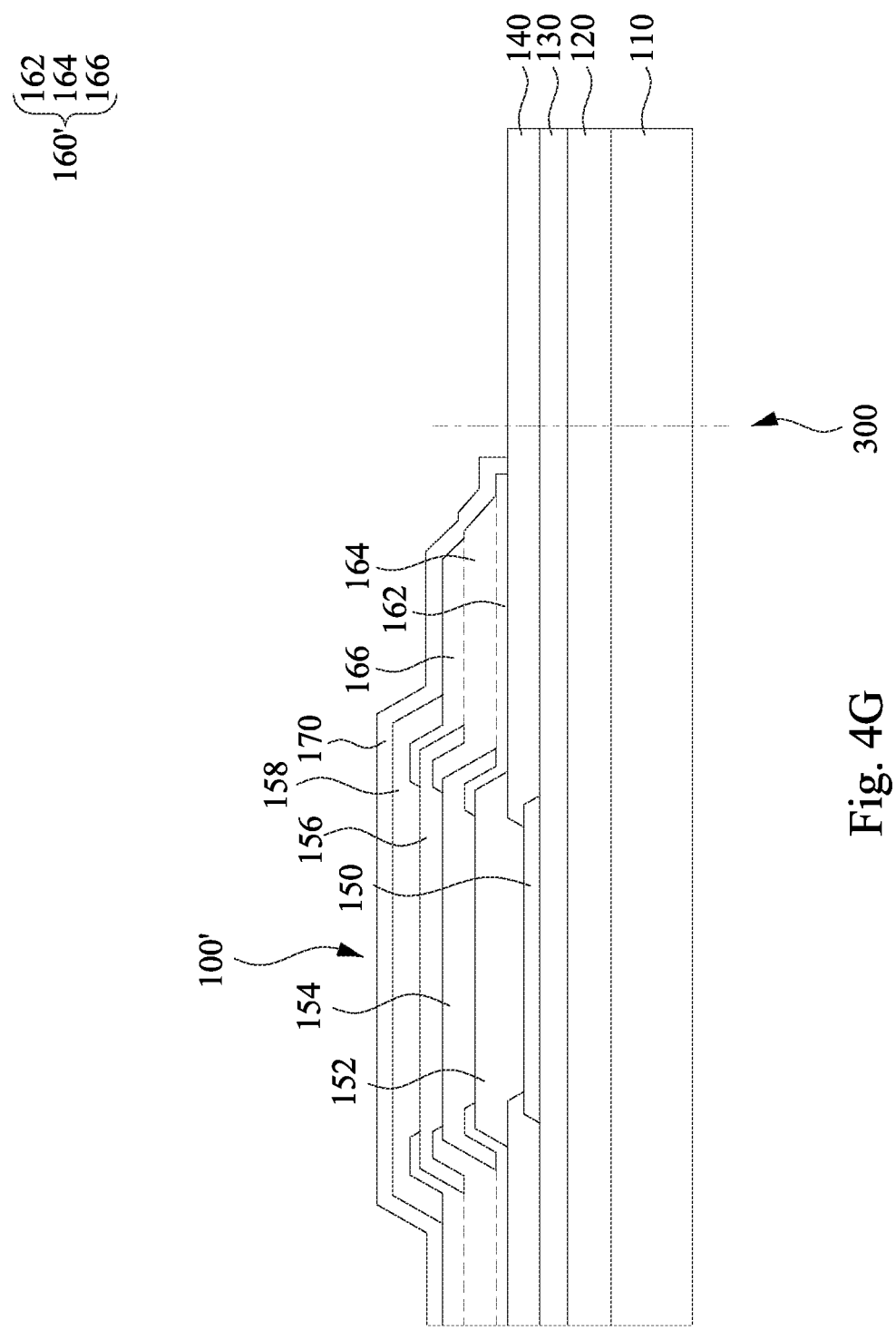

Referring to FIG. 4G, the transparent conductive layer 170 is formed above the metal layer 158 to cover the metal layer 158 and the interlayer insulation layer 160'. The transparent conductive layer 170 may include suitable material to conformally cover the interlayer insulation layer 160' and the metal layer 158 above the interlayer insulation layer 160', thereby forming a firm contact stack 100'. For example, the transparent conductive layer 170 may include Indium Tin Oxide (ITO). In some embodiments, the transparent conductive layer 170 may be patterned so that the sidewall of the transparent conductive layer 170 is distanced from the cutting line 300 of the substrate 110 and that the cutting line 300 is between the sidewall of the transparent conductive layer 170 and the sidewall of the substrate 110. In some other embodiments, the sidewall of the transparent conductive layer 170 may be coplanar with the cutting line 300 of the substrate 110.

Figure 4H:
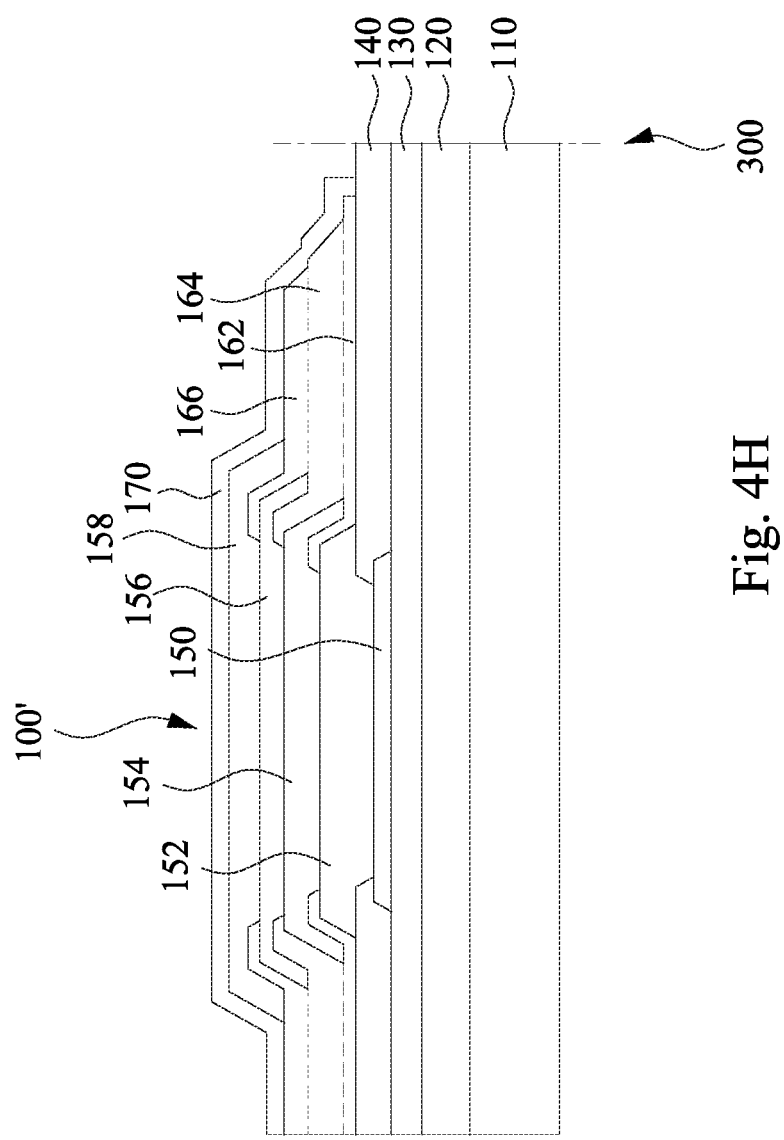

Referring to FIG. 4H, the substrate 110 is cut along the cutting line 300 to form the display panel 20. In the cutting process of the substrate 110, the substrate 110, the buffer layer 120, the insulation layer 130, and the dielectric layer 140 are cut together to form the coplanar sidewall of the substrate 110, the substrate 110, the buffer layer 120, the insulation layer 130, and the dielectric layer 140. As shown in FIG. 4H, the sidewall of the interlayer insulation layer 160' is away from the cutting line 300 so the interlayer insulation layer 160' would not be cut during the cutting process. This prevents the interlayer insulation layer 160' from the formation of crack or breakage. Therefore, the interlayer insulation layer 160' may maintain the integrity of the contact stack 100' after cutting the substrate 110, reducing the damage of the periphery circuit region of the display panel 20, and improving the yield of the display panel 20.

According to the above-mentioned embodiments of the present disclosure, the display panel manufactured by the illustrated method includes a pixel pad layer in the pixel region of the substrate and a contact stack in the periphery circuit region of the substrate. The contact stack includes the multilayer structure formed of the metal layers and the interlayer insulation layer. The interlayer insulation layer is positioned between a first metal layer and a second metal layer of the metal layers, where the interlayer insulation layer includes a top portion covering the edge of the top surface of the first metal layer, and the second metal layer is electrically connected to the top surface of the first metal layer exposed by the interlayer insulation layer. Since the sidewall of the interlayer insulation layer is recessed from the sidewall of the substrate by a distance greater than zero, the interlayer insulation layer would not be cut with the substrate during the cutting process. This prevents the interlayer insulation layer from the formation of crack or breakage by the cutting operation. Therefore, the interlayer insulation layer away from the sidewall of the substrate can improve the structure integrity of the contact stack to keep the function of the periphery circuit region of the display panel and provide the frameless splicing display panel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
   a substrate;
   a pixel pad layer above the substrate; and
   a contact stack above the substrate and electrically connected to the pixel pad layer, wherein the contact stack comprises:
      a first metal layer;
      a second metal layer above the first metal layer; and
      a first interlayer insulation layer between the first metal layer and the second metal layer,
      wherein the first interlayer insulation layer comprises a first top portion covering an edge of a top surface of the first metal layer, and the first interlayer insulation layer comprises a side portion covering a sidewall of the first metal layer,
      wherein the second metal layer is electrically connected to the top surface of the first metal layer exposed by the first interlayer insulation layer,
      wherein a sidewall of the first interlayer insulation layer is recessed from a sidewall of the substrate by a first distance greater than zero, and
      wherein the sidewall of the first interlayer insulation layer and the side portion of the first interlayer insulation layer are at the same side of the first metal layer.

2. The display panel of claim 1, wherein the sidewall of the first interlayer insulation layer is recessed from the sidewall of the substrate by the first distance between 0.1 µm and 1 µm.

3. The display panel of claim 1, wherein a second distance between a sidewall of the second metal layer and the sidewall of the substrate is between 20 µm and 200 µm.

4. The display panel of claim 1, wherein the second metal layer covers the side portion of the first interlayer insulation layer.

5. The display panel of claim 1, wherein the first top portion of the first interlayer insulation layer is sandwiched between the top surface of the first metal layer and a bottom surface of the second metal layer.

6. The display panel of claim 1, wherein the first interlayer insulation layer comprises a first opening exposing the top surface of the first metal layer, and the second metal layer extends through the first opening to contact the top surface of the first metal layer.

7. The display panel of claim 1, wherein the contact stack further comprises:
   a third metal layer between the first interlayer insulation layer and the second metal layer; and
   a second interlayer insulation layer between the third metal layer and the second metal layer, wherein the second interlayer insulation layer comprises a second top portion covering an edge of a top surface of the third metal layer.

8. The display panel of claim 7, wherein a sidewall of the second interlayer insulation layer is recessed from the sidewall of the first interlayer insulation layer by a third distance greater than zero.

9. The display panel of claim 8, wherein the sidewall of the second interlayer insulation layer is recessed from the sidewall of the first interlayer insulation layer by the third distance between 0.1 µm and 1 µm.

10. The display panel of claim 7, wherein the third metal layer covers the first side portion of the first interlayer insulation layer, the second interlayer insulation layer comprises a second side portion covering a sidewall of the third metal layer, and the second metal layer covers the second side portion of the second interlayer insulation layer.

11. The display panel of claim 1, wherein the contact stack further comprises:
   a metal underlayer below the first metal layer; and
   a dielectric layer between the metal underlayer and the first metal layer, wherein the dielectric layer comprises a second opening exposing a top surface of the metal underlayer, the first metal layer extends through the second opening to contact the metal underlayer.

12. The display panel of claim 11, wherein a sidewall of the dielectric layer is coplanar with the sidewall of the substrate.

13. The display panel of claim 1, wherein the contact stack is disposed in a periphery circuit region of the display panel.

14. The display panel of claim 1, further comprising:
   a transparent conductive layer continuously covering the pixel pad layer and the contact stack.

15. The display panel of claim 14, wherein a sidewall of the transparent conductive layer is noncoplanar with the sidewall of the substrate.

16. A method of manufacturing a display panel, comprising:
   forming a first metal layer above a substrate;
   forming a first interlayer insulation layer above the first metal layer, wherein the first interlayer insulation layer comprises a top portion covering an edge of a top surface of the first metal layer and a side portion covering a sidewall of the first metal layer, and a sidewall of the first interlayer insulation layer is recessed from a sidewall of the substrate by a first distance greater than zero; and
   forming a second metal layer above the first interlayer insulation layer and the first metal layer, wherein the second metal layer extends through the first interlayer insulation layer and is electrically connected to the first metal layer to form a contact stack, wherein the sidewall of the first interlayer insulation layer and the side portion of the first interlayer insulation layer are at the same side of the first metal layer.

17. The method of claim 16, further comprising:
   cutting the substrate along a cutting line of the substrate after forming the contact stack, wherein the sidewall of the first interlayer insulation layer is between the sidewall of the first metal layer and the cutting line.

18. The method of claim 17, wherein a second distance between the sidewall of the first interlayer insulation layer and the cutting line is between 0.1 μm and 1 μm.

19. The method of claim 17, wherein a third distance between a sidewall of the second metal layer and the cutting line is between 20 μm and 200 μm.

20. The method of claim 16, wherein forming the first interlayer insulation layer comprises:
forming a first insulation layer above the first metal layer that conformally covers the first metal layer, wherein the sidewall of the first insulation layer is coplanar with the sidewall of the substrate; and
patterning the first insulation layer to form the first interlayer insulation layer, wherein the first interlayer insulation layer comprises a first opening exposing the top surface of the first metal layer, and the sidewall of the first interlayer insulation layer after being patterned is recessed from the sidewall of the substrate by the first distance.

\* \* \* \* \*